United States Patent
Lim et al.

(10) Patent No.: US 8,558,359 B2
(45) Date of Patent: Oct. 15, 2013

(54) SEMICONDUCTOR PACKAGE HAVING LEAD FRAMES

(75) Inventors: Chang Hyun Lim, Seoul (KR); Chang Jae Heo, Gyunggi-do (KR); Young Ki Lee, Gyunggi-do (KR); Sung Keun Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 10 days.

(21) Appl. No.: 13/352,146

(22) Filed: Jan. 17, 2012

(65) Prior Publication Data

US 2013/0105954 A1    May 2, 2013

(30) Foreign Application Priority Data

Oct. 28, 2011    (KR) .................. 10-2011-0110915

(51) Int. Cl.
- *H01L 23/495* (2006.01)
- *H01L 23/48* (2006.01)
- *H01L 23/52* (2006.01)

(52) U.S. Cl.
USPC .......... 257/668; 257/675; 257/676; 257/690; 257/693; 257/696; 257/700; 257/706; 257/713

(58) Field of Classification Search
USPC ......... 257/668, 675, 676, 690, 692, 693, 694, 257/695, 696, 700, 706, 713, E23.012, 257/E23.015, E23.016

See application file for complete search history.

(56) References Cited

U.S. PATENT DOCUMENTS

| | | | | |
|---|---|---|---|---|
| 8,115,294 | B2 * | 2/2012 | Otremba et al. | 257/690 |
| 2002/0027271 | A1 * | 3/2002 | Vaiyapuri | 257/676 |
| 2004/0000703 | A1 * | 1/2004 | Lee et al. | 257/675 |
| 2006/0261453 | A1 * | 11/2006 | Lee et al. | 257/676 |
| 2007/0228545 | A1 * | 10/2007 | Ramakrishna et al. | 257/686 |
| 2009/0200660 | A1 * | 8/2009 | Awad et al. | 257/704 |
| 2012/0068317 | A1 * | 3/2012 | Haba et al. | 257/676 |
| 2012/0241928 | A1 * | 9/2012 | Tay et al. | 257/668 |
| 2012/0299119 | A1 * | 11/2012 | Xue et al. | 257/401 |

FOREIGN PATENT DOCUMENTS

JP    05-226575    9/1993

* cited by examiner

*Primary Examiner* — Ngan Ngo
(74) *Attorney, Agent, or Firm* — Ladas & Parry, LLP

(57) ABSTRACT

Disclosed herein is a semiconductor package, including: a substrate having a first surface and a second surface; at least one semiconductor device formed on the first surface of the substrate; first lead frames respectively formed at both sides of the first surface of the substrate; and second lead frames respectively formed at both sides of the second surface of the substrate, wherein the first lead frame and the second lead frame are spaced apart from each other by an isolation distance base.

18 Claims, 3 Drawing Sheets

SEMICONDUCTOR PACKAGE HAVING LEAD FRAMES

CROSS REFERENCE TO RELATED APPLICATION

This application claims the benefit of Korean Patent Application No. 10-2011-0110915, filed on Oct. 28, 2011, entitled "Semiconductor Package", which is hereby incorporated by reference in its entirety into this application.

BACKGROUND OF THE INVENTION

1. Technical Field

The present invention relates to a semiconductor package.

2. Description of the Related Art

As the usage amount of energy is increased over the world, a power conversion apparatus, such as an inverter, which is used in homes or industries, is increasingly employed for efficient use of energy and protection of environment.

As disclosed in Document 1, an intelligent power module (IPM), which has received attention together with the increase in employment of the inverter, is a key component in performing DC rectification and AC conversion in the inverter, and may be applied to home appliances such as a refrigerator, a washer, an air conditioner, and the like, industrial applications such as industrial motors, and the next generation applications such as a hybrid electric vehicle (HEV) and the like.

In general, a large amount of heat is generated during a power conversion procedure. If this generated heat is not efficiently removed, overall performance of the entire system including modules may be degraded and they may be damaged.

Further, since the multi-function and small size of component parts are recently necessary factors also in the IPM, improvement in structure for multi-function and compactness as well as efficient radiation of heat generated due to these are also important factors.

[Document 1] JP 1993-226575 A 1993. 9. 3

SUMMARY OF THE INVENTION

The present invention has been made in an effort to provide a semiconductor package capable of satisfying the isolation distance conditions between package constituents as well as decreasing the size of a module.

According to one preferred embodiment of the present invention, there is provided a semiconductor package, including: a substrate having a first surface and a second surface; at least one semiconductor device formed on the first surface of the substrate; first lead frames respectively formed at both sides of the first surface of the substrate; and second lead frames respectively formed at both sides of the second surface of the substrate, wherein the first lead frame and the second lead frame are spaced apart from each other by an isolation distance base.

The first lead frames and the second lead frames may be arranged in a row of plural lead frames, respectively.

The row of the first lead frames and the row of the second lead frames may be formed in parallel with each other based on a length direction of the substrate, respectively, and the first lead frames and the second lead frames may be formed alternately with each other. The first lead frame and the second lead frame may be spaced apart from each other by a predetermined creepage distance base.

The first lead frame and the second lead frame may be spaced apart from each other by a predetermined clearance distance base.

The semiconductor package may further include via passing through from the first surface to the second surface of the substrate.

The semiconductor package may further include a heat radiating plate formed on the second surface of the substrate, the heat radiating plate being spaced apart from the second lead frame by a predetermined isolation distance.

The semiconductor device may be a power device or a control device.

The substrate may be a ceramic substrate or an anodized metal substrate in a case where the semiconductor device includes the power device.

The substrate may be a printed circuit board in a case where the semiconductor device includes the control device.

The semiconductor package may further include a molding member covering an upper portion of the substrate including the semiconductor device, and both lateral surfaces of the substrate.

According to one preferred embodiment of the present invention, there is provided a semiconductor package, including: a substrate having a first surface and a second surface; at least one semiconductor device formed on the first surface of the substrate; first lead frames respectively formed at both sides of the first surface of the substrate; second lead frames respectively formed at both sides of the second surface of the substrate; and a heat radiating plate formed on the second surface of the substrate, wherein the first lead frame and the second lead frame are spaced apart from each other by an isolation distance base.

The heat radiating plate may be spaced apart from the second lead frame by a predetermined isolation distance.

The first lead frames and the second lead frames may be arranged in a row of plural lead frames, respectively.

The row of the first lead frames and the row of the second lead frames may be formed in parallel with each other based on a length direction of the substrate, respectively, and the first lead frames and the second lead frames may be formed alternately with each other.

The first lead frame and the second lead frame may be spaced apart from each other by a predetermined creepage distance base.

The first lead frame and the second lead frame may be spaced apart from each other by a predetermined clearance distance base.

The semiconductor package may further include via passing through from the first surface to the second surface of the substrate.

DESCRIPTION OF THE PREFERRED EMBODIMENTS

Figure 1:
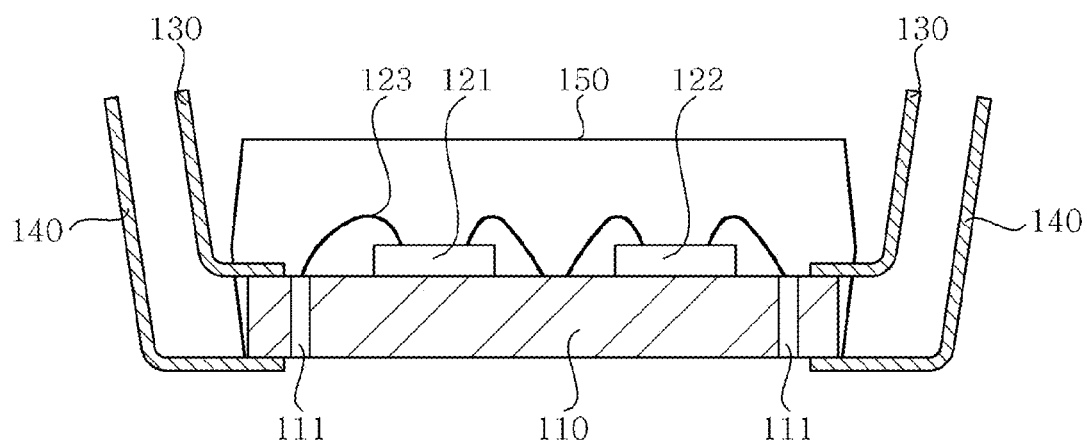
FIG. 1 is a cross-sectional view showing the structure of a semiconductor package according to a preferred embodiment of the present invention.

Various objects, advantages and features of the invention will become apparent from the following description of preferred embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. Terms used in the specification, 'first', 'second', etc., can be used to describe various components, but the components are not to be construed as being limited to the terms.

Hereinafter, preferred embodiments of the present invention will be described in detail with reference to the accompanying drawings.

Semiconductor Package

Figure 2:
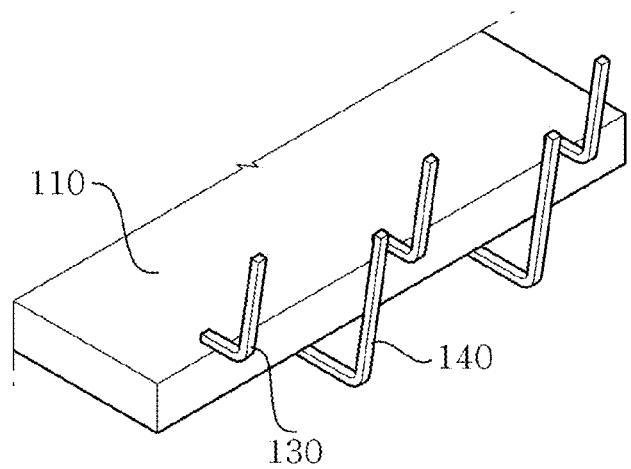
FIG. 2 is a view specifically showing the structure of a lead frame according to the preferred embodiment of the present invention.
Figure 3:
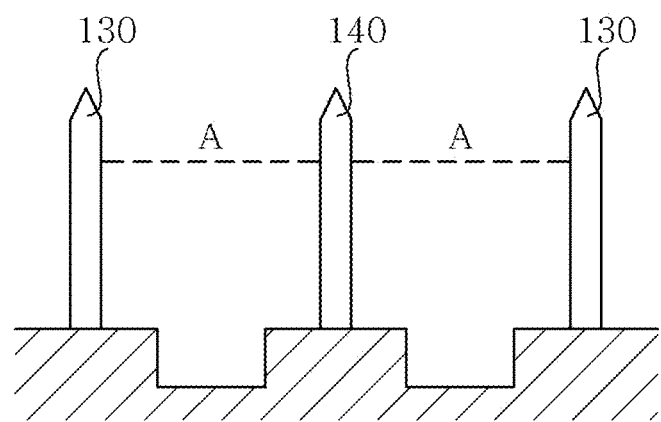
FIGS. 3 and 4 are views illustrating a forming method of the lead frame according to the preferred embodiment of the present invention.
Figure 4:
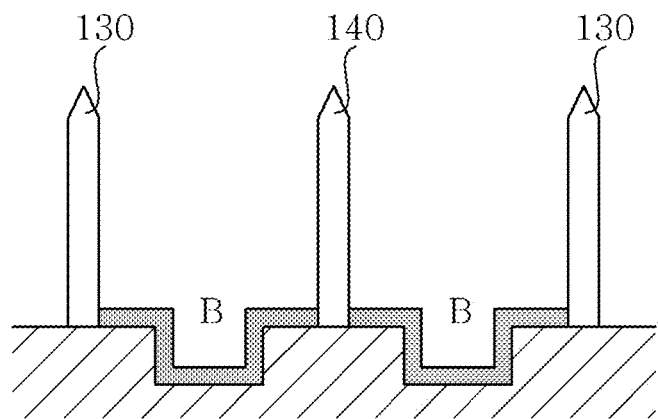
Figure 5:
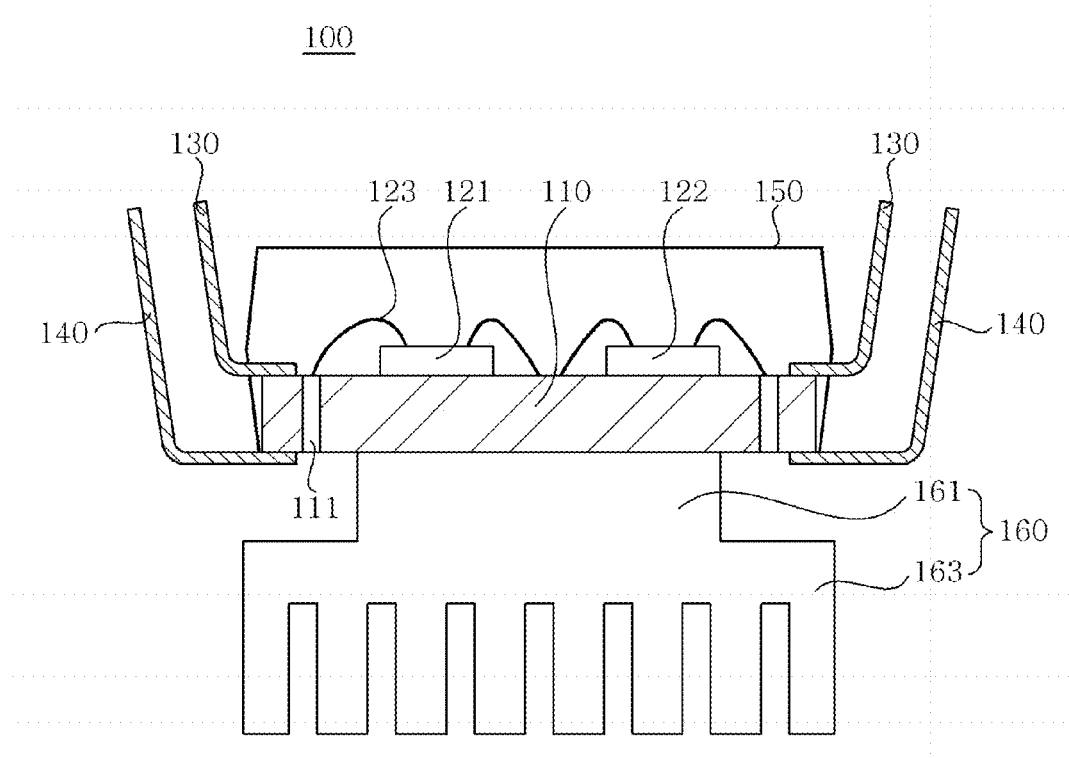
FIG. 5 is a view showing the structure in which a heat radiating plate is formed on the semiconductor package according to the preferred embodiment of the present invention.

FIG. 1 is a cross-sectional view showing the structure of a semiconductor package according to a preferred embodiment of the present invention; FIG. 2 is a view specifically showing the structure of a lead frame according to the preferred embodiment of the present invention; FIGS. 3 and 4 are views illustrating a forming method of the lead frame according to the preferred embodiment of the present invention; and FIG. 5 is a view showing the structure in which a heat radiating plate is formed on the semiconductor package according to the preferred embodiment of the present invention.

As shown in FIG. 1, a semiconductor package 100 may include a substrate 110 having first and second surfaces, semiconductor devices 121 and 122 formed on the first surface of the substrate 110, first lead frames 130 respectively formed at both sides of the first surface of the substrate 110, and second lead frames 140 respectively formed at both sides of the second surface of the substrate 110.

Here, the semiconductor devices 121 and 122 may include a power device or a control device.

For example, the power device may include devices generating a large heat amount such as, an insulated gate bipolar transistor (IGBT), diode, and the like, and the control device may include devices generating a small heat amount, such as an integrated circuit (IC).

Meanwhile, if the semiconductor devices 121 and 122 are power devices, the substrate 110 may be a ceramic substrate or an anodized metal substrate (AMS) in consideration of heat radiation properties, but is not limited thereto.

Even if the semiconductor devices 121 and 122 include both of the power device and the control device, a ceramic substrate or an anodized metal substrate may be employed in consideration of heat radiation properties.

On the other hand, if the semiconductor devices 121 and 122 are control devices, a printed circuit board may be employed because the substrate 110 generates a smaller heat amount than the power device, but is not limited thereto.

The first lead frame 130 and the second lead frame 140 may be spaced apart from each other according to isolation distance bases.

More specifically, as shown in FIG. 3, the first lead frame 130 and the second lead frame 140 may be formed such that they are spaced apart from each other by a predetermined clearance distance base A.

In addition, as shown in FIG. 4, the first lead frame 130 and the second lead frame 140 may be formed such that they are spaced apart from each other by a predetermined creepage distance base B.

As shown in FIG. 2, the first lead frames 130 and the second lead frames 140 may be arranged in a row of plural lead frames, respectively.

Here, as shown in FIG. 2, the row of the first lead frames 130 and the row of the second lead frames 140 each are formed in parallel with each other based on a length direction of the substrate 110, respectively. The first lead frames 130 and the second lead frames 140 may be formed alternatively with each other.

That is, as shown in FIG. 2, the first lead frames 130 and the second lead frames 140 are formed not opposite to each other but alternately with each other based on a thickness direction of the substrate 110.

The reason is that an isolation distance is maintained so as to prevent a short circuit from occurring between the first lead frame 130 and the second lead frame 140 during high-voltage driving of the semiconductor package.

Also, as shown in FIG. 2, the second lead frame 140 may be further protruded from a lateral surface of the substrate 110 than the first lead frame 130. The isolation distance between the first lead frame 130 and the second lead frame 140 is taken into consideration.

The semiconductor package 100 may further include via 111 passing through from a first surface to a second surface of the substrate 110.

Here, the via 111 may perform electric functions, and also may function to fast transfer the heat generated from the semiconductor devices 121 and 122 to a lower portion of the substrate 110.

In addition, the semiconductor package 100 may further include wires 123 for electric functions between the semiconductor devices and the substrate.

In addition, as shown in FIG. 5, the semiconductor package 100 may further include a heat radiating plate 160 formed on the second surface of the substrate 110.

Here, the heat radiating plate 160 may be spaced apart from the second lead frames 140 by a predetermined isolation distance.

More specifically, as shown in FIG. 5, the heat radiating plate 160 may be divided into a first plate 161 and a second plate 163. The first plate 161 may be contacted with the second surface of the substrate 110. Here, the first plate 161 may be formed on the center portion of the second surface of the substrate 110 such that the first plate 161 is spaced apart from a region where the second lead frames 140 are formed in order to maintain the isolation distance with the second lead frames 140.

Here, a thickness of the first plate 161 is determined based on the thickness direction of the substrate 110, in consideration of the isolation distance base between the semiconductor package including the second lead frame 140 and the second plate 163. In other words, the reason is that the second plate 163 can be spaced apart from the second lead frames 140 by the isolation distance.

The heat radiating plate 160 is made of a metal having excellent heat conductivity. Therefore, electric short circuits may occur between a lead frame of a semiconductor package (including a semiconductor package employing a power device) and a heat radiating plate in a case where a device such as the power device is operated at a high voltage.

In the preferred embodiment of the present invention, in order to prevent electric short circuits between the second lead frames 140 and the heat radiating plate 160, isolation distances such as a creepage distance, a clearance distance, and the like are determined in consideration of usage voltages such as an operation voltage, an impulse voltage, and the like, when the semiconductor package and the heat radiating plate are designed. Here, as the operation voltage of the power device increases, a larger creepage distance and a larger clearance distance are required.

Meanwhile, the semiconductor package 100 may further include a molding member 150 covering the upper portion of the substrate 110 including the semiconductor devices 121 and 122, and both lateral surfaces of the substrate 110.

In a case of the semiconductor package employing a power device or a control device, it may be difficult to reduce the size of a module due to limitation conditions of isolation distances (for example, a creepage distance and a clearance distance) between the lead frames. In the present preferred embodiment, since the lead frames are formed on the first surface and the second surface of the substrate, the above-cited isolation distance conditions can be satisfied as well as the size of the module can be reduced.

According to the semiconductor package of the present invention, the lead frames are formed on upper and lower surfaces of the substrate and thus, the isolation distance conditions between the lead frames can be satisfied as well as the size of the module can be reduced, thereby enhancing competiveness of applied products and allowing competitive production cost.

Further, since the lead frames are formed on upper and lower surfaces of the substrate in the semiconductor package according to the present invention, an arrangement space of the lead frames can be enlarged and thus, the degree of circuit design freedom can be improved.

Although the preferred embodiments of the present invention have been disclosed for illustrative purposes, they are for specifically explaining the present invention and thus the semiconductor package according to the present invention is not limited thereto, but those skilled in the art will appreciate that various modifications, additions and substitutions are possible, without departing from the scope and spirit of the invention as disclosed in the accompanying claims.

Accordingly, any and all modifications, variations or equivalent arrangements should be considered to be within the scope of the invention, and the detailed scope of the invention will be disclosed by the accompanying claims.

What is claimed is:

1. A semiconductor package, comprising:
a substrate having a first surface and a second surface;
at least one semiconductor device formed on the first surface of the substrate;
first lead frames respectively formed at both sides of the first surface of the substrate; and
second lead frames respectively formed at both sides of the second surface of the substrate,
wherein:
the first lead frame and the second lead frame are spaced apart from each other by an isolation distance base; and
the first lead frame and the second lead frame are formed alternately with each other based on a vertical direction of the substrate.

2. The semiconductor package as set forth in claim 1, wherein the first lead frames and the second lead frames are arranged in a row of plural lead frames, respectively.

3. The semiconductor package as set forth in claim 2, wherein the row of the first lead frames and the row of the second lead frames are formed in parallel with each other based on a length direction of the substrate, respectively, and the first lead frames and the second lead frames are formed alternately with each other.

4. The semiconductor package as set forth in claim 1, wherein the first lead frame and the second lead frame are spaced apart from each other by a predetermined creepage distance base.

5. The semiconductor package as set forth in claim 1, wherein the first lead frame and the second lead frame are spaced apart from each other by a predetermined clearance distance base.

6. The semiconductor package as set forth in claim 1, further comprising via passing through from the first surface to the second surface of the substrate.

7. The semiconductor package as set forth in claim 1, further comprising a heat radiating plate formed on the second surface of the substrate, the heat radiating plate being spaced apart from the second lead frame by a predetermined isolation distance.

8. The semiconductor package as set forth in claim 1, wherein the semiconductor device is a power device or a control device.

9. The semiconductor package as set forth in claim 1, wherein the substrate is a ceramic substrate or an anodized metal substrate in a case where the semiconductor device includes the power device.

10. The semiconductor package as set forth in claim 1, wherein the substrate is a printed circuit board in a case where the semiconductor device includes the control device.

11. The semiconductor package as set forth in claim 1, further comprising a molding member covering an upper portion of the substrate including the semiconductor device, and both lateral surfaces of the substrate.

12. A semiconductor package, comprising:
a substrate having a first surface and a second surface; at least one semiconductor device formed on the first surface of the substrate;
first lead frames respectively formed at both sides of the first surface of the substrate;
second lead frames respectively formed at both sides of the second surface of the substrate; and a heat radiating plate formed on the second surface of the substrate,
wherein the first lead frame and the second lead frame are spaced apart from each other by an isolation distance base.

13. The semiconductor package as set forth in claim 12, wherein the heat radiating plate is spaced apart from the second lead frame by a predetermined isolation distance.

14. The semiconductor package as set forth in claim 12, wherein the first lead frames and the second lead frames are arranged in a row of plural lead frames, respectively.

15. The semiconductor package as set forth in claim 14, wherein the row of the first lead frames and the row of the second lead frames are formed in parallel with each other based on a length direction of the substrate, respectively, and the first lead frames and the second lead frames are formed alternately with each other.

16. The semiconductor package as set forth in claim 12, wherein the first lead frame and the second lead frame are spaced apart from each other by a predetermined creepage distance base.

17. The semiconductor package as set forth in claim 12, wherein the first lead frame and the second lead frame are spaced apart from each other by a predetermined clearance distance base.

18. The semiconductor package as set forth in claim 12, further comprising via passing through from the first surface to the second surface of the substrate.

* * * * *